US008259537B2

(12) United States Patent
Koch

(10) Patent No.: US 8,259,537 B2
(45) Date of Patent: Sep. 4, 2012

(54) TIME BASE DEVICE FOR A WATCH

(75) Inventor: Daniel Koch, Crèmines (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 432 days.

(21) Appl. No.: 12/563,675

(22) Filed: Sep. 21, 2009

(65) Prior Publication Data

US 2010/0080088 A1 Apr. 1, 2010

(30) Foreign Application Priority Data

Sep. 29, 2008 (EP) ..................................... 08165408

(51) Int. Cl.
*G04B 37/00* (2006.01)
*H05K 7/00* (2006.01)

(52) U.S. Cl. ........................... 368/88; 368/157; 361/728

(58) Field of Classification Search .................... 368/87, 368/88, 156, 157, 159, 160, 204; 310/348; 361/728, 736, 760, 761
See application file for complete search history.

(56) References Cited

U.S. PATENT DOCUMENTS

| | | | | | |
|---|---|---|---|---|---|
| 3,691,753 | A | * | 9/1972 | Kurita | 368/156 |
| 3,784,725 | A | | 1/1974 | Perkins et al. | |
| 3,810,354 | A | * | 5/1974 | Naikaido et al. | 368/156 |
| 3,902,312 | A | * | 9/1975 | Yamazaki | 368/156 |
| 3,925,693 | A | * | 12/1975 | Meister et al. | 310/348 |
| 4,177,631 | A | * | 12/1979 | Yamada et al. | 368/76 |
| 4,243,329 | A | * | 1/1981 | Nakayama | 368/76 |
| 4,496,246 | A | * | 1/1985 | Ota et al. | 368/88 |
| 4,555,184 | A | * | 11/1985 | Fujimori | 368/88 |
| 5,912,592 | A | * | 6/1999 | Kikushima | 331/68 |
| 2006/0140061 | A1 | * | 6/2006 | Haga | 368/88 |
| 2010/0246340 | A1 | * | 9/2010 | Meier et al. | 368/159 |

FOREIGN PATENT DOCUMENTS

| | | |
|---|---|---|
| EP | 1 581 917 | 10/2005 |
| EP | 1 890 204 | 2/2008 |
| FR | 2 283 478 | 3/1976 |
| WO | 2004/061588 | 7/2004 |

OTHER PUBLICATIONS

European Search Report issued in corresponding application No. EP 08 16 5408, completed Jan. 13, 2009.
Computer Professional's Dictionary 267 (1990).

* cited by examiner

*Primary Examiner* — Vit W Miska
(74) *Attorney, Agent, or Firm* — Griffin & Szipl, P.C.

(57) ABSTRACT

The time base device for a watch includes at least one electric motor coil (30), an electronic module (1) that has at least one time base oscillator circuit mounted in a case of the module, and an electric power source (8). The electric motor coil (30), the electronic module (1) with an oscillator circuit and the voltage source (8), which is preferably a battery, are connected to each other mechanically and electrically without the use of a printed circuit board to form a compact unit. The electronic module includes four connection terminals (14, 15, 16, 17) on an external surface for connecting the voltage source on one side and the wires (31, 32) of a winding of the coil (30) on the other side.

16 Claims, 2 Drawing Sheets

TIME BASE DEVICE FOR A WATCH

This application claims priority from European Patent Application No. 08165408.9 filed Sep. 29, 2008, the entire disclosure of which is incorporated herein by reference.

FIELD OF THE INVENTION

The present invention concerns a time base device for a watch, particularly an electronic watch. The time base device has at least one electric motor coil able to be used for driving analogue display means, a module that has at least one time base oscillator circuit mounted in a case of the module, and an electric power source.

BACKGROUND TO THE INVENTION

In the state of the art, it is known to make a time base device for a timepiece movement with an oscillator connected to a quartz resonator. This time base device also includes a frequency divider for dividing the oscillator frequency, and a control circuit for an electric motor connected to the frequency divider. The electric motor is controlled by the control circuit for driving, in particular, the hands of a time display, for example on a watch dial.

Each element of the time base device is generally secured to at least one printed circuit board, on which electrical connections are made between the various electronic elements of the time base device. The printed circuit board, including the time base device, may also be connected to the watch movement. These different elements are also powered by a voltage source, such as a battery or accumulator, which may be mounted in a housing provided for this purpose, which is connected to the printed circuit board. The assembly of all of these time base device electronic elements thus occupies a relatively large volume, which is a drawback for assembly or integration in a timepiece of small dimensions.

In order to reduce the volume of the electronic element assembly of the time base device, it is known to use a quartz resonator, in the form of a tuning fork associated with an oscillator, to form one part of the time base. The tuning fork quartz resonator and the integrated circuit including the oscillator may be grouped together within the same case.

Grouping together various electronic components in the same case is known, in particular from U.S. Pat. No. 3,784,725. In that document, an electronic assembly for a watch forms a single unit. Electronic components of the assembly are mounted and connected, generally individually, on a printed circuit board, which may create some problems and costs for mounting in a watchcase of small dimensions. However, this electronic assembly groups together all of the electronic components, and the dial, to facilitate mounting the assembly in a conventional watch movement, a plastic watchcase or a piece of jewellery.

Although the prior solutions can partly reduce the volume occupied particularly by some components of a time base, the available space remains, nonetheless, insufficient to make a timepiece of small dimensions. The need to mount several integrated circuits to perform several watch functions on one or more printed circuit boards means that a large amount of space is occupied in the watch. This requires increasing the volume of the watch excessively, which is undesirable.

SUMMARY OF THE INVENTION

It is thus a main object of the invention to overcome the aforementioned drawbacks, by providing a time base device for a watch, which is compact and easy to handle for assembly operations in a watchcase of small dimensions.

The present invention, in accordance with a first non-limiting embodiment, concerns a time base device for a watch including at least one coil of an electric motor, an electronic module having at least one time base oscillator circuit mounted in a case of the module, and an electric power voltage source, the time base device being characterized in that the coil, the electronic module with an oscillator circuit and the voltage source are connected to each other mechanically and electrically without using a printed circuit board so as to form a compact unit.

Particular embodiments of the time base device are defined in accordance with second to eleventh non-limiting variations of the first embodiment. For example, in accordance with a second embodiment of the present invention, the first embodiment is modified so that the time base device for a watch includes the at least one coil of the electric motor, wherein the electronic module has at least one time base oscillator circuit mounted in the case of the module, and the electric power voltage source, wherein the coil, the electronic module with an oscillator circuit, and the voltage source, are connected to each other mechanically and electrically without using the printed circuit board so as to form a compact unit, wherein the electronic module includes, inside the case, an oscillator, a frequency divider and a control circuit for an electric motor, wherein the oscillator and the frequency divider form the time base oscillator circuit, which is powered from outside the case by the voltage source.

In accordance with a third embodiment of the present invention, the second embodiment is further modified so that the oscillator is connected to the inside of the case, to a piezoelectric resonator, such as a quartz resonator, or a silicon MEMS resonator, and wherein the oscillator, the frequency divider and the motor control circuit are made in a single integrated circuit. In accordance with a four embodiment of the present invention, the second embodiment is further modified so that the oscillator, the frequency divider and the motor control circuit are made in several integrated circuits. In accordance with a fifth embodiment of the present invention, the third embodiment is further modified so that contact pads of the integrated circuit are connected to conductive bumps that have the same arrangement as the contact pads, wherein the conductive connection bumps are arranged on an inner surface of a bottom wall of the case of the electronic module, and wherein conductive paths connect some conductive bumps on the inner surface of the bottom wall, to the resonator and to connection terminals, which are arranged outside the module case. In accordance with a sixth embodiment of the present invention, the fifth embodiment is further modified so that some conductive paths connect at least four connection terminals via conductive holes through the bottom wall of the case, and wherein the four connection terminals are arranged at the four corners of the external rectangular surface, wherein the first two connection terminals are connected to the voltage source by means of two contact flanges and the second two connection terminals are connected on an opposite side to the first two terminals, respectively to two metal wires of a winding of an electric motor coil, with the control circuit in the case controlling the motor to drive analogue display means. In accordance with a seventh embodiment of the present invention, the sixth embodiment is further modified so that the electronic module includes three second external connection terminals, which are respectively connected to three metal wires of at least one winding of a two-phase motor coil.

In accordance with an eighth embodiment of the present invention, the first embodiment is further modified so that the electronic module is housed in a receptacle that is open on at least a top surface, and wherein the electronic module includes four connection terminals arranged at the four corners of an external rectangular surface of a bottom wall of a case, wherein the module is arranged in the receptacle such that the four connection terminals are accessible through the open top surface of the receptacle. In accordance with a ninth embodiment of the present invention, the eighth embodiment is further modified so that the external surface of the module, on which the connection terminals are placed, is arranged at the same level as the mouth of the open top surface of the receptacle, wherein the first two connection terminals are connected via two metal flanges to the two negative and positive poles of the voltage source, such as a battery, and wherein the second two connection terminals on an opposite side to the first connection terminals, are each connected to a respective metal wire of the coil of an electric motor. In accordance with a tenth embodiment of the present invention, the ninth embodiment is further modified so that the coil, or the voltage source, or the coil and the voltage source, are secured to the receptacle as a support to define a compact unit. In accordance with an eleventh embodiment of the present invention, the ninth embodiment is further modified so that the receptacle forms one part of a watch movement or part of a watch.

In accordance with a preferred embodiment of the present invention, a time base device for a watch is provided that includes at least one electric motor coil, an electronic module that has at least one time base oscillator circuit mounted in a case of the module, and an electric power source. The electric motor coil, the electronic module with an oscillator circuit and the voltage source, which is preferably a battery, are connected to each other mechanically and electrically without the use of a printed circuit board to form a compact unit. The electronic module includes four connection terminals on an external surface for connecting the voltage source on one side and the wires of a winding of the coil on the other side.

One advantage of the time base device according to the invention lies in the fact that the electrical connection between the voltage source, which may be a battery, or an accumulator, and the electronic time base module, and the electrical connection between the motor coil and the electronic module are achieved without the use of a printed circuit board. Metal flanges connect the positive and negative battery poles to two external connection terminals of the module, and two metal wires of a coil winding are directly connected to two other external connection terminals of the module. In the case of a two-phase motor, there may advantageously be three metal coil wires directly connected to the three external connection terminals of the module.

Because the electronic module advantageously contains within the same case, an oscillator, such as a quartz oscillator, a frequency divider and a motor control circuit, only 4, or 5 electrical connection terminals are required on an external surface of the module case. The oscillator, frequency divider and control circuit may form a single integrated circuit. This reduces the volume of all the elements of the time base device, i.e. it reduces the volume of the watch movement by moving the motor closer to the battery.

Grouping together the various elements of the time base device in a reduced space also reduces the length of the connections between the electronic elements of the device, and also the sensitivity of the oscillator to external interference. This also removes several mechanical operations for assembling the electronic components, which reduces the production costs of the movement fitted with the time base device according to the invention.

BRIEF DESCRIPTION OF THE DRAWINGS

The objects, advantages and features of the time base device for a watch will appear more clearly in the following description made in a non-limiting manner with reference to the drawings, in which.

DETAILED DESCRIPTION OF THE INVENTION

In the following description, all those elements of the time base device for an electronic watch that are well known to those skilled in the art in this technical field are related merely in a simplified manner.

Figure 1:
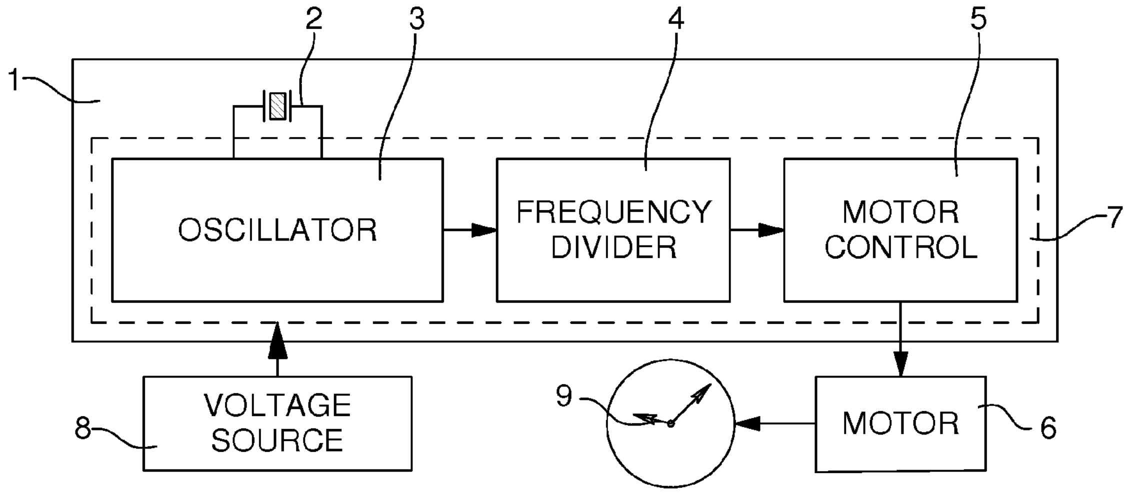
FIG. 1 shows a schematic view of an electronic watch with an analogue display, which includes the time base device according to the invention.

FIG. 1 shows schematically various components of an electronic watch, which includes a time base device according to the invention. This watch has a voltage source 8, for example a battery or an accumulator, for powering an electronic module 1 that has a time base and means for controlling an electric motor 6. The electric motor is controlled so that it drives gear trains (not shown) for rotating the analogue display means, such as hands 9, used for indicating the time, for example.

The time base device is essentially formed of voltage source 8, electronic module 1, and at least one coil of an electric motor 6. These time base device elements are advantageously mechanically and electrically connected without using a printed circuit board to form a compact unit of small dimensions, as explained below with reference to FIG. 2.

Electronic module 1 includes, in a case, an oscillator 3, which may be an oscillator with, for example, a piezoelectric resonator 2, as a quartz resonator, or even a silicon MEMS resonator connected to the terminals of oscillator 3. Electronic module 1 further includes a frequency divider 4, whose input is connected to the output of oscillator 3, to obtain the desired working frequency for the watch so as to indicate the exact time. The output of frequency divider 4 is connected to a control circuit 5 for an electric motor 6 for driving hands 9. Oscillator 3, with resonator 2, and frequency divider 4 may form part of a time base oscillator circuit.

A Lavet-type stepping motor may be used as electric motor 6, also called a bipolar motor, formed of a magnetised rotor, a stator with high magnetic permeability to form the magnetic circuit loop, and at least one coil. The function of this coil, when it is live, is to create a magnetic field in the stator, which thus converts to a magnet whose polarity depends upon the direction of the current in the coil. Thus, control circuit 5 for motor 6 supplies a current that flows in the coil. The motor is controlled by a series of positive and negative pulses separated by a current outage. However, other types of motor may be used, such as, for example, a two-phase stepping motor, to obtain a two-directional motor that can set the time of the watch both forwards and backwards. In the case of a two-phase motor, three motor outputs have to be provided on electronic module 1.

Advantageously, as shown in FIG. 1, oscillator 3, frequency divider 4 and the electric motor control circuit 5 all form part of a single integrated circuit 7. This reduces the space occupied by these electronic elements in electronic module 1, and decreases electromagnetic interference on the electronic elements, due in particular to the length of the wired connections between the elements.

Figure 2:
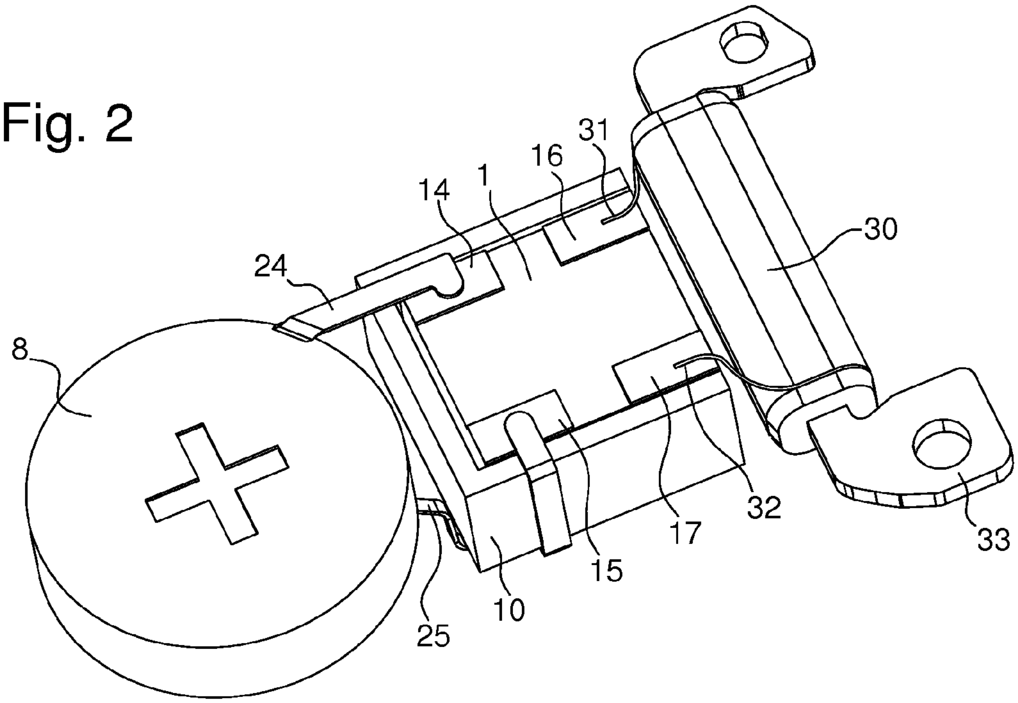
FIG. 2 shows a three-dimensional view of the various elements of the time base device according to the invention.
Figure 3:
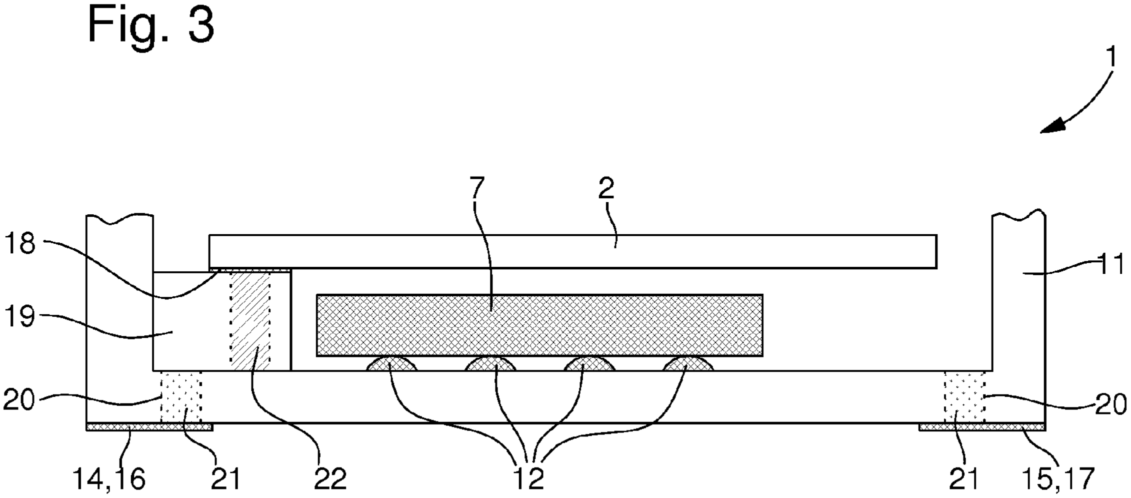
FIG. 3 shows a partial longitudinal cross-section of the electronic module of the time base device according to the invention.
Figure 4:
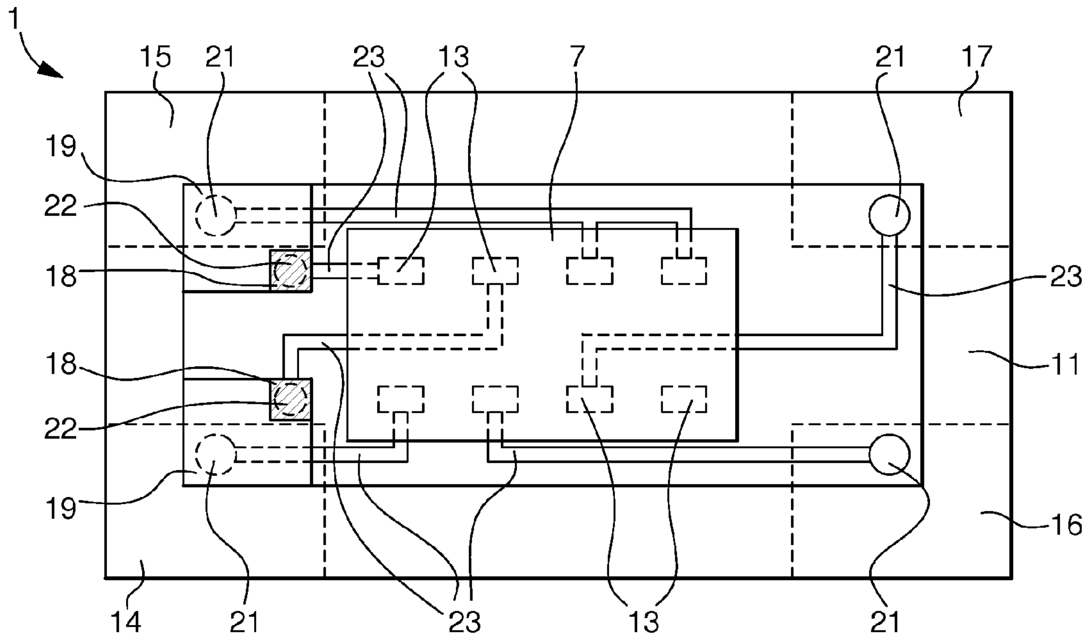
FIG. 4 is a partial top view of the electronic module of the time base device according to the invention.

As FIGS. 2 to 4 show, and owing to the grouping of all the elements described above within electronic module 1, the electronic module 1 only has four, or five external connection terminals instead of eight terminals as is normal. Indeed, two connection terminals are normally provided for exciting resonator 2, two other terminals for connection to integrated circuit 7, two more terminals for powering the integrated circuit and finally two terminals for controlling the motor. In electronic module 1, four terminals shown in the Figures, or five terminals are necessary on the outside of the case, namely the two terminals for powering the integrated circuit and the two or three terminals for connecting the integrated circuit to control the motor. The other terminals are arranged only inside the case of electronic module 1.

FIG. 2 shows a three-dimensional view of the time base device according to the present invention. The same reference signs are used for identical elements explained with reference to FIG. 1. This time base device therefore includes a voltage source 8, which is preferably a battery, an electronic module 1 and an electric motor coil 30.

Contained in a case, particularly a ceramic case, electronic module 1 comprises the oscillator and resonator, the frequency divider and the electric motor control circuit. As explained above, the oscillator, the frequency divider and the control circuit may form a single integrated circuit, but of course, one could envisage making these elements on more than one integrated circuit, if necessary.

Four connection terminals 14, 15, 16 and 17 are provided on an external surface of electronic module 1. These connection terminals, as explained with reference to FIGS. 3 and 4, are arranged on an external surface of one wall of the case. The integrated circuit and conductive connecting paths that connect the integrated circuit to the resonator and to the connection terminals are mounted on the inner surface of the wall. The four connection terminals shown are preferably arranged respectively at the four corners of the external surface. These connection terminals on the external surface are advantageously used as a base for connecting other elements of the time base device. This simplifies assembly of the time base device elements of the watch movement, and also greatly reduces the volume of the assembly by reducing the number of components.

This electronic module 1 may be housed in a receptacle 10 of generally parallelepiped shape, which is open over one or two surfaces. Receptacle 10 may be defined as all or part of a metal or plastic plate, or may form part of an integrated watch movement. In the example shown in FIG. 2, receptacle 10 is open on two surfaces.

Once electronic module 1 has been secured, for example by bonding, in the receptacle, its four, or five connection terminals are accessible from an open top surface of the receptacle. Preferably, the external surface of module 1, on which connection terminals 14, 15, 16 and 17 are placed, is arranged at the same level as the mouth of the open top surface of receptacle 10, particularly at the top edge of the vertical receptacle walls. This facilitates the electrical and mechanical connection of the other elements of the time base device.

The first two connection terminals 14 and 15 of the external surface of the module are for electrical connection, respectively via two conventional metal flanges 24 and 25, to the two positive and negative poles of voltage source 8, which is preferably a battery here. A first flange 24 is secured or welded to one of the first metal connection terminals 14 so as to connect the positive pole of the battery, whereas the second flange 25, which surrounds an external part of receptacle 10, is secured or welded to the other first metal connection terminal 15 so as to connect the negative pole of the battery.

The second two connection terminals 16 and 17 of the external surface of the module, which are arranged on an opposite side to the first two terminals 14 and 15, are connected to a conventional winding of an electric motor coil 30. A first metal wire 31 of coil 30 is welded to one of the second metal connection terminals 16, whereas a second metal wire 32 of coil 30 is welded to the other second metal connection terminal 17. The core of coil 30 is one part of a magnetic circuit 33, which may be secured, for example by screws through two apertures provided for this purpose, to another part of a magnetic circuit of the electric motor that is not shown.

One could also envisage using receptacle 10 of electronic module 1 as a support for motor coil 30, possibly with the entire mechanism thereof. This coil may also be directly secured to the edge of an open lateral surface of receptacle 10. Battery connection flanges 24 and 25 may be integrated in a housing for receiving the battery, which is not shown. This housing may form part of receptacle 10 or be secured to a lateral wall of the receptacle.

The arrangement of all the elements inside the, for example, ceramic case of the electronic module, is now explained with reference to FIGS. 3 and 4. The same reference signs are used for identical elements explained with reference to FIGS. 1 and 2.

FIG. 3 is a median and longitudinal cross-section of electronic module 1 of the time base device. Inside case 11 of the module, resonator 2 is secured by welding or bonding with a conductive adhesive the connection pads of two groups of electrodes located on the resonator base to corresponding conductive paths 18 provided on steps 19 of the bottom of case 11. This allows resonator 2 to be positioned above integrated circuit 7 arranged on an inner surface of a bottom wall of case 11.

The connection between the connection pads located on the base of resonator 2 and integrated circuit 7 for exciting the electrodes and vibrating the resonator may be achieved via conductive pads 18, connected to holes 22. These holes 22 are formed in steps 19 and filled with a suitable conductive material, and connected to conductive paths arranged on the inner surface of the bottom wall of the case. These conductive paths are in turn connected to corresponding contact pads of integrated circuit 7.

Integrated circuit 7 may be connected at the exterior of the case to connection terminals 14, 15, 16 and 17, which are arranged on an external surface of the bottom wall of the case, as explained above. In order to do this in this example, connections studs 12 are provided on the inner surface of the bottom wall, advantageously underneath integrated circuit 7. These connection studs or bumps 12 are arranged in the same arrangement as contact pads of integrated circuit 7 so that they can electrically connect the contact pads of the integrated circuit via flip chip technology. Some of the integrated circuit contact pads are thus electrically connected by conductive paths to the external connection terminals 14, 15, 16 and 17, via holes 20 that pass through the bottom wall of case 11, which are filled with a conductive adhesive 21 or any other suitable conductive material. As these holes are located opposite connection terminals 14, 15, 16 and 17, conductive adhesive 21 provides the electrical connection with the inside of the case.

FIG. 4 is a top view of electronic module 1, without a sealed cover, of the time base device. For the sake of simplification, the resonator is not shown in the case, which may be made of ceramic material and of generally parallelepiped shape. The cover, which is not shown, but which hermetically seals the case, may advantageously be made of glass to allow precise laser adjustment of the resonator frequency.

Inside case 11 of electronic module 1, an integrated circuit 7 is secured via its contact pads 13, shown transparently, onto connection bumps (not shown), which are arranged on the inner surface of the bottom wall of the case. As indicated above, the arrangement of the contact bumps is the same as that of contact pads 13, so that the integrated circuit can be secured by the flip chip technique. Integrated circuit 7 includes the oscillator, frequency divider and the electric motor control circuit.

The resonator electrodes (not shown) are welded onto conductive pads 18, which are connected to holes 22. These holes 22 are formed in steps 19 and filled with a suitable conductive material, such as a conductive adhesive or metal. Thus conductive pads 18 are connected to conductive paths 23, arranged on the inner surface of the bottom wall of the case. These conductive paths 23 connect conductive pads 18 to some of contact pads 13 of integrated circuit 7, and also some of the other conductive pads 13 of integrated circuit 7 to the external connection terminals 14, 15, 16 and 17.

Integrated circuit 7 is electrically connected to the external connection terminals via holes 20 that traverse the bottom wall of case 11. These holes 20 are filled with a conductive adhesive 21 or any other suitable conductive material. Since the holes are located opposite connection terminals 14, 15, 16 and 17, conductive adhesive 21 provides electrical connection to the electronic elements in the case. The first two external connection terminals 14, 15 are connected to a voltage source, such as a battery, for powering integrated circuit 7. The second two external connection terminals 16 and 17 are connected to a winding of an electric motor coil to supply positive and negative electrical pulses.

Because of the arrangement of integrated circuit 7, which is connected to the resonator inside the case, the space occupied by the all of these elements is optimised. Moreover, integrated circuit(s) 7 are protected from any external interference, also because of the relatively short connection paths between the various elements.

From the description that has just been given, those skilled in the art can devise several variants of the compact time base device without departing from the scope of the invention defined by the claims. Several electric motors could be connected across the same connection terminals of the electronic module or across different connection terminals. The actuation timing of each of the motors connected to the electronic module may be different. The electronic module may be connected to the voltage source and to the coil without being arranged in a receptacle. The voltage source powering the electronic module with electricity may be formed in part by a solar cell in combination with a battery or accumulator.

The invention claimed is:

1. A time base device for a watch, the time base device including;

(a) at least one coil of an electric motor, (b) an electronic module having at least one time base oscillator circuit mounted in a case of the electronic module; and (c) an electric power voltage source, wherein the at least one coil, the electronic module with the at least one time base oscillator circuit, and the voltage source, are connected to each other mechanically and electrically to form a compact unit without using a printed circuit board, wherein the electronic module is housed in a receptacle that is open on a top surface, and wherein the electronic module includes four connection terminals on an external rectangular surface of a bottom wall of the case of the electronic module, wherein the electronic module is arranged in the receptacle so that the four connection terminals are accessible through the open top surface of the receptacle.

2. The time base device according to claim 1, wherein the electronic module includes, inside the case, an oscillator, a frequency divider and a control circuit for an electric motor, wherein the oscillator and the frequency divider form the at least one time base oscillator circuit, and the at least one time base oscillator circuit is powered from outside the case by the voltage source.

3. The time base device according to claim 2, wherein the oscillator is connected to the inside of the case, to a piezoelectric resonator, wherein the piezoelectric resonator is a quartz resonator or a silicon MEMS resonator, and wherein the oscillator, the frequency divider and the motor control circuit are made in a single integrated circuit.

4. The time base circuit according to claim 2, wherein the oscillator, the frequency divider and the motor control circuit are made in several integrated circuits.

5. The time base device according to claim 3, wherein contact pads of the integrated circuit are connected to conductive connection bumps that have the same arrangement as the contact pads, wherein the conductive connection bumps are arranged on an inner surface of a bottom wall of the case of the electronic module, and wherein conductive paths connect some conductive connection bumps on the inner surface of the bottom wall to the piezoelectric resonator and to connection terminals that are arranged outside the case of the electronic module.

6. The time base device according to claim 5, wherein some conductive paths connect at least four connection terminals via conductive holes through the bottom wall of the case, and wherein the at least four connection terminals are arranged at the four corners of an external rectangular surface, wherein a first two connection terminals of the at least four connection terminals are connected to the voltage source by two contact flanges and a second two connection terminals of the at least four connection terminals are directly connected on an opposite side to the first two connection terminals, respectively, to two metal wires of a winding of an electric motor coil, wherein the control circuit in the case controls the said motor to drive analogue display means.

7. The time base device according to claim 6, wherein the electronic module includes three second external connection terminals that are respectively connected to three metal wires of at least one winding of a two-phase motor coil.

8. The time base device according to claim 1, wherein the four connection terminals are arranged at the four corners of the external rectangular surface of the bottom wall of the case.

9. The time base device according to claim 8, wherein the external surface of the module, on which the four connection terminals are placed, is arranged at the same level as a mouth of an open top surface of a receptacle, wherein two first connection terminals of the four connection terminals are connected via two metal flanges to two negative and positive poles of the voltage source, and wherein two second connection terminals on an opposite side to the two first connection terminals are each connected to a respective metal wire of the at least one coil of the electric motor.

10. The time base device according to claim 9, wherein the coil, or the voltage source, or the coil and the voltage source, are secured to the receptacle as a support to define a compact unit.

11. The time base device according to claim 9, wherein the receptacle forms one part of a watch movement or part of a watch.

12. The time base device according to claim 9, wherein the voltage source is a battery.

13. A watch comprising a time base device, wherein the time base includes:

(a) at least one coil of an electric motor, (b) an electronic module having at least one time base oscillator circuit mounted in a case of the electronic module; and (c) an electric power voltage source, wherein the at least one coil, the electronic module with the at least one time base oscillator circuit, and the voltage source, are connected to each other mechanically and electrically to form a compact unit without using a printed circuit board, wherein the electronic module is housed in a receptacle that is open on a top surface, and wherein the electronic module includes four connection terminals on an external rectangular surface of a bottom wall of the case of the electronic module, wherein the electronic module is arranged in the receptacle so that the four connection terminals are accessible through the open top surface of the receptacle.

14. A time base device for a watch, the time base including:

(a) at least one coil of an electric motor;

(b) an electronic module having at least one time base oscillator circuit mounted in a case of the electronic module; and (c) an electric power voltage source, wherein the at least one coil, the electronic module with the at least one time base oscillator circuit, and the voltage source, are connected to each other mechanically and electrically to form a compact unit without using a printed circuit board, wherein the electronic module is housed in a receptacle that is open on a top surface, and wherein the electronic module includes four connection terminals on an external rectangular surface of a bottom wall of the case, wherein the electronic module is arranged in the receptacle so that the four connection terminals are accessible through the open top surface of the receptacle and are arranged at the four corners of the external rectangular surface of the bottom wall of the case.

15. A time base device for a watch, the time base including:

(a) at least one coil of an electric motor;

(b) an electronic module having at least one time base oscillator circuit mounted in a case of the electronic module; and (c) an electric power voltage source, wherein the at least one coil, the electronic module with the at least one time base oscillator circuit, and the voltage source, are connected to each other mechanically and electrically to form a compact unit without using a printed circuit board, wherein the electronic module is housed in a receptacle that is open on a top surface, and wherein the electronic module includes four connection terminals on an external rectangular surface of a bottom wall of the case of the electronic module, wherein the electronic module is arranged in the receptacle so that the four connection terminals are accessible through the open top surface of the receptacle, wherein the four connection terminals are arranged at the same level as the mouth of the open top surface of the receptacle, wherein two first connection terminals of the four connection terminals are connected via two metal flanges to two negative and positive poles of the voltage source, and wherein the two second connection terminals of the four connection terminals are on an opposite side to the two first connection terminals, and each are directly connected to a respective metal wire of the at least one coil of the electric motor.

16. The time base device according to claim 15, wherein the voltage source is a battery.

* * * * *